April 24, 1956 H. R. KAISER ET AL 2,743,325

UNITY GAIN AMPLIFYING SYSTEM

Filed Dec. 17, 1952

INVENTORS,
HAROLD R. KAISER,
BY JOHN A. MITCHELL,

Seymour M. Rosenberg
ATTORNEY

United States Patent Office 2,743,325

Patented Apr. 24, 1956

2,743,325

UNITY GAIN AMPLIFYING SYSTEM

Harold R. Kaiser, Woodland Hills, and John A. Mitchell, Glendale, Calif., assignors, by mesne assignments, to Hughes Aircraft Company, a corporation of Delaware Application December 17, 1952, Serial No. 326,502

11 Claims. (Cl. 179—171.1)

The present invention relates to unity gain amplifying systems and more particularly to a unity gain amplifying system having a gain substantially independent of variations in circuit parameters.

In numerous electrical circuits, the need frequently arises for a unity gain amplifier which will maintain its gain constant despite variations in the values of various circuit components. Such amplifiers are frequently used, for example, where it is desired to isolate a source of applied signals from a load, or to perform an impedance matching operation, without change in signal levels.

It is well known that the characteristics of electron discharge devices are not constant over extended periods of operation, but tend to vary. Likewise, the circuit components associated with such devices may themselves vary in value. These variations would normally tend to affect the gain of the amplifier, unless special steps are taken to prevent such variations. It is thus seen that an ideal unity gain amplifying system may be defined as an amplifying system which inherently maintains its gain constant at unity despite variations in circuit parameters.

It is conventional, in analyzing the operation of an amplifying system, to denominate the effect of variations in particular circuit parameters on the overall gain of the system as the sensitivity of the system. The sensitivity may be represented by a fraction having as its denominator percentage change in value of a circuit parameter, and as its numerator the resulting percentage change in overall gain of the system. Expressed in this manner, the sensitivity of an ideal unity gain amplifying system would be zero for any circuit parameter, and, therefore, how closely a particular amplifying system approaches the ideal may be judged by how closely its sensitivity approaches zero.

It is clear that the overall gain of an amplifying system may be affected by variations in the value of any circuit parameter. Ordinarily, however, since electron discharge devices are the most variable constituents of a complete amplifying system, the sensitivity of the system with respect to variations in the characteristics of the vacuum tubes therein is of primary significance.

A number of prior art unity gain amplifying systems are shown at chapter 9 of Vacuum Tube Amplifiers, volume 18 of the M. I. T. Radiation Laboratory series, published in 1948 by McGraw-Hill Book Company, Inc., New York and London. However, none of the two-stage systems disclosed in this publication has a sensitivity of overall gain to amplification factor or $\mu$, of the first or input amplifier stage, less than $1/\mu$. When conventional vacuum tubes are employed as the first amplifier stage a $\mu$ of 100 is representative, and, therefore, a sensitivity of overall gain to variations in the $\mu$ of the first stage of .01 may be expected. Using the formula outlined above, a variation in the $\mu$ of the first stage of 30% may result in a variation of overall gain of the system of approximately .3%.

A number of circuits have been suggested by the prior art for overcoming this limitation. For example, several three-tube unity gain amplifying systems are illustrated in the above-cited publication. However, the fact that three tubes are employed makes it necessary to include in the circuit special filters to attenuate the high and low frequency response of the system, in order to prevent self-oscillation. Thus the frequency response of the system must be arbitrarily restricted. Further, the use of three tubes increases the power drain of the system, and reduces the reliability.

The present invention, on the other hand, discloses a two-stage unity gain amplifying system which overcomes many of the disadvantages of the prior art. According to the present invention, the system includes a first electronic amplifier stage having first and second input circuits, and an output circuit, and a second electronic amplifier stage having an input circuit and an output circuit. The output circuit of the first electronic amplifier stage is connected to the input circuit of the second electronic amplifier stage, while the output circuit of the second electronic amplifier stage is connected to the second input circuit of the first electronic amplifier stage.

The input signal to the system is applied to the first input circuit of the first electronic amplifier stage, and the output signal of the system may be taken from the output circuit of the second electronic amplifier stage. The input circuits of the first electronic amplifier stage are so arranged that the signal which appears at the output circuit of the stage has a first component which corresponds in amplitude and polarity to the signal appearing on the first input circuit and a second component which corresponds in amplitude and polarity to the signal differential between the signals appearing at the first and second input circuits. The output signal of the second electronic amplifier stage corresponds in amplitude and polarity to its input signal.

With the arrangement set forth above, and more particularly with a vacuum tube amplifier and a cathode follower as the first and second electronic amplifier stages, respectively, the amplifying system according to the present invention exhibits a sensitivity of gain with respect to $\mu$ of the vacuum tube which theoretically is zero. In actual practice, circuits constructed according to the present invention have a sensitivity of an order of magnitude less than $1/\mu$, with respect to variations in any of the circuit parameters. The system is inherently stable against self-oscillation, and, therefore, it is unnecessary to incorporate special filter networks to restrict the band width. Because only two stages are used, a minimum number of components is required and their reliability is accordingly increased while the power drawn is reduced.

In addition, because of the unique phase relationship between the signals appearing at the output circuits of the system according to the present invention, an additional coupling network may be interconnected between the output circuits to further decrease the sensitivity of the system. This additional coupling network applies at least a portion of the output signal of the second stage to what, in effect, may be considered as a third input circuit of the first stage. In other words, with the addition of this coupling network in the amplifying system of this invention, the output signal of the first stage includes a third component having an amplitude and polarity corresponding to the output signal of the second stage.

It is therefore an object of the present invention to provide an amplifying system having a sensitivity of gain with respect to variations in circuit parameters which is essentially zero.

It is also an object of the present invention to provide a unity gain amplifying system having a gain substantially independent of variations in circuit parameters.

A further object of the present invention is to provide a highly stable unity gain amplifying system employing a minimum of components.

Another object of the present invention is to provide a unity gain amplifying system which may employ relatively broad tolerance components.

A still further object of the present invention is to provide a unity gain amplifying system having a high inherent stability against self-oscillation without the use of special filter networks.

Still another object of the present invention is to provide a unity gain amplifying system which requires a minimum of power for its operation.

The novel features which are believed to be characteristic of the invention, both as to its organization and method of operation, together with further objects and advantages thereof, will be better understood from the following description considered in connection with the accompanying drawings, in which two embodiments of the invention are illustrated by way of examples. It is to be expressly understood, however, that the drawings are for the purpose of illustration and description only, and are not intended as a definition of the limits of the invention.

Figure 1:
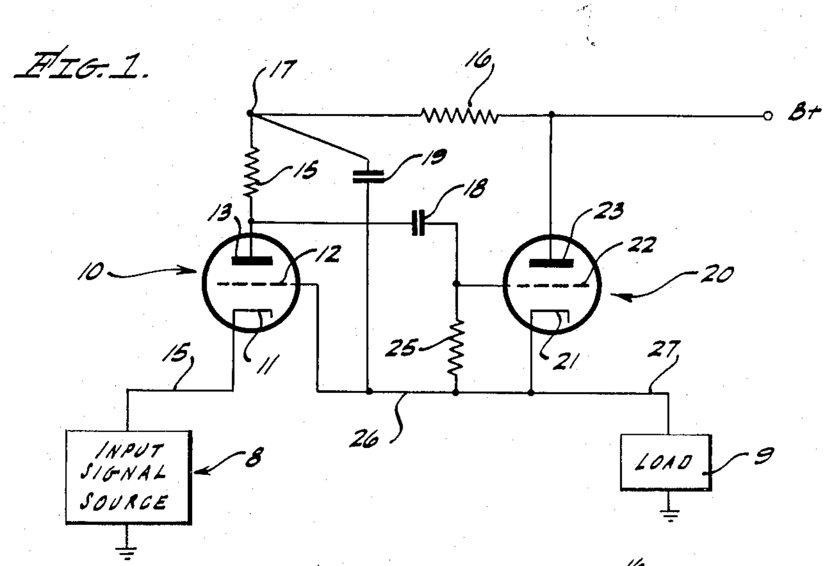
Fig. 1 is a circuit diagram of one embodiment of the amplifying system of this invention.

Referring now to the drawings, there is shown in Fig. 1 a circuit diagram of one embodiment of the unity gain amplifying system according to the present invention. As shown in Fig. 1, the amplifying system comprises a first electronic amplifier stage 10 having first and second input circuits and an output circuit, and a second electronic amplifier stage 20 having an input circuit coupled to the output circuit of first stage 10 and an output circuit coupled to a load 9 and to the second input circuit of amplifier 10. The input signal from input signal source 8 is applied to the first input circuit of first stage 10 which operates to produce across its output circuit a signal having an amplitude and a polarity which is dependent upon the signal differential between the signals appearing across the first and second input circuits, and the amplitude of the signal appearing across the first input circuit.

More specifically, in the embodiment shown in Fig. 1, first stage 10 includes an electronic vacuum tube having a cathode 11, a control electrode or grid 12, and an anode 13. The input signals appearing at one terminal of source 8 are applied to cathode 11 by means of a lead 15, the other terminal of the source being grounded. Anode 13 of stage 10 is connected through an anode load resistor, including a pair of series resistors 15 and 16 having a common junction 17, to the +B terminal of a direct-current power supply, not designated, the other terminal of the power supply being grounded.

Second stage 20 includes a cathode follower having a cathode 21, a control electrode or grid 22, and an anode 23 connected directly to the +B terminal of the power supply. Grid 22 of cathode follower stage 20 is coupled to anode 13 of first stage 10 by means of a capacitor 18 and to cathode 21 by means of a grid leak resistor 25. Cathode 21 is connected to load 9 by means of a lead 27, the other terminal of the load being returned to ground. Cathode 21 is also connected to grid 12 of first stage 10 by means of a lead 26. A capacitor 19 is connected between cathode 21 and junction 17.

In operation, it will be assumed first that capacitor 19 is omitted from the circuit of Fig. 1. Application of an input signal to the cathode input circuit of the first stage will cause a signal current to flow in the anode circuit through resistors 15 and 16, thereby producing a corresponding signal voltage between anode 13 and ground. With capacitor 18 selected to offer negligible impedance to the flow of current at the signal frequency, the anode-ground signal voltage of the first stage will also appear between grid 22 and ground, and, therefore, between cathode 21 and ground of the cathode follower stage.

Summarizing the operation of the circuit of Fig. 1 without capacitor 19, it will be noted that the signal which appears between anode 13 and ground of first stage 10 is a function of, and has the same polarity as the input signal.

Since no signal phase inversion occurs in cathode follower stage 20, the output signal of the cathode follower stage will also have the same polarity as the input signal.

Consider now the effect of returning the output voltage of cathode follower stage 20 to grid 12 of the first stage, by means of lead 26. The signal appearing in the anode circuit of first stage 10 will now include an additional component which is a function of the difference of potential between the signal on grid 12 and the signal on cathode 11. In other words, the signal voltage appearing between anode 13 and ground of first stage 10 will have a first component which is a function of the cathode input signal and a second component which is a function of the difference of potential between the signal voltages appearing on grid 12 and cathode 11. This second component will have the same polarity as the first component, and will increase the signal voltage appearing between anode and ground, when the grid signal voltage is less than the cathode signal voltage. On the other hand, when the grid signal voltage is greater than the cathode signal voltage, the second component will have a polarity opposite from that of the first component, and thus reduce the signal voltage appearing between anode and ground.

In order to more completely describe the operation and advantages of the system of the invention, expressions for the overall system gain and sensitivity may be derived by means of conventional circuit analysis.

Following the scheme of analysis utilized in chapter 9 of volume 18, Vacuum Tube Amplifiers, previously cited, the alternating-current anode current of the first stage may, in the case of a triode, be written as $$i_p = g_m\left(e_{gk} + \frac{e_{pk}}{\mu}\right) \qquad (1)$$

where $i_p$ is the alternating-current anode current
$e_{gk}$ the alternating current grid-cathode signal voltage
$e_{pk}$ the alternating-current plate-cathode signal voltage
and $g_m$ and $\mu$ are the transconductance and amplification factor respectively for the electron discharge device.

If $e_i$ represents the alternating-current input signal to the system, $e_o$ the alternating current output signal voltage of the system, $R_1$ the load resistance of the first stage anode circuit (as represented here, resistance 15+resistance 16) and A the gain of the cathode follower stage, then $e_{gk}$ may be written as $e_o - e_i$, and $e_o$ may be written as $-Ai_pR_1$. Therefore, $e_{gk}$ may be written as $$-Ai_pR_1 - e_i$$

Also $e_{pk}$ may be expressed as $-i_pR_1 - e_i$.

Substituting these equivalent expressions appropriately in (1) yields $$i_p = g_m\left(-Ai_pR_1 - e_i - \frac{i_pR_1}{\mu} - \frac{e_i}{\mu}\right) \qquad (2)$$

The overall gain of the system, G, is equal to $e_0$ divided by $e_i$, which may be written as $$G=\frac{-Ai_pR_1}{e_i} \qquad (3)$$

Substituting (2) in (3), factoring and rearranging terms, yields $$G=\frac{\frac{A(\mu+1)}{\mu}}{g_mR_1+1+A\mu} \qquad (4)$$

If $r_p$ is the alternating-current anode resistance of the electron discharge device, then $$r_p=\frac{\mu}{g_m}$$

Substitution of this relationship into (4) and rearrangement of terms yields a gain for the circuit of Fig. 1, omitting capacitor 19, of $$G=\frac{1}{1+\frac{r_p/R_1+1-A}{A(\mu+1)}} \qquad (5)$$

The sensitivity of the system with respect to variations in the amplification factor of the first stage may be derived from (5). In differential form, $$\text{Sensitivity}=\frac{\frac{dG}{G}}{\frac{d\mu}{\mu}}=\frac{\mu\left(\frac{r_p}{R_1}+1-A\right)}{\mu+1\left(\frac{r_p}{R_1}+1+A\mu\right)} \qquad (6)$$

Theoretically, if $$\frac{r_p}{R_1}$$

approaches zero, and A, the gain of the cathode follower stage, approaches 1, the overall gain G approaches 1, as a limit, and the sensitivity approaches zero as a limit. In actual practice, if $$\frac{r_p}{R_1}=.2$$

$A=.95$, and $\mu=100$, an overall gain of .997 and a sensitivity of .0025 results. Thus a sensitivity of an order of magnitude less than $1/\mu$ may be achieved in a practical circuit.

The sensitivity of the system to variations in other circuit parameters besides the amplification factor may be similarly derived. However, in each case, the sensitivity which may be achieved theoretically will be zero; in actual practice, each sensitivity may be less than $1/\mu$.

The gain of the system may be made to approach unity more closely, and the sensitivity more nearly zero, by including capacitor 19, connected between cathode 21 of cathode follower stage 20 and junction 17. Assuming the capacitor offers negligible impedance to the flow of current at the signal frequency, junction 17 will now have the same signal potential as cathode 21. Following the notation previously adopted, it can be shown that the system now has an overall gain G′, where $$G'=\frac{1}{1+\frac{(1-A)\left(1+\frac{r_p}{R_1}\right)}{A(\mu+1)}} \qquad (7)$$

and a sensitivity of gain with respect to $\mu$ of amplifier 10, $$\text{Sensitivity}'=\frac{\mu}{\mu+1}\,\frac{\left(\frac{r_p}{R_1}+1\right)(1-A)}{\frac{r_p}{R_1}(1-A)+A\mu+1} \qquad (8)$$

From the formulas, it can be seen that as the gain of the cathode follower stage approaches 1, the overall gain of the system approaches 1 as a limit, and the sensitivity approaches zero as a limit. In a practical circuit, if $$\frac{r_p}{R_1}=.2$$

$A=.95$, and $\mu=100$, an overall system gain of .999 and a sensitivity of .0006 may be achieved. This sensitivity is considerably less than $1/\mu$, and of an order of magnitude less than that of the circuit of Fig. 1 without capacitor 19. The sensitivity of the system including capacitor 19 to variations in other circuit parameters besides the amplification factor of the electron discharge device may be similarly derived and will be of similar magnitude.

The addition of capacitor 19 to the system previously described, besides reducing the sensitivity of the system, and making the gain more nearly equal to unity, also increases the alternating-current input impedance of the system. In addition, since all of the elements of the first stage of the system are maintained at substantially the same potential, the effect of interelectrode capacities is negligible.

Summarizing the effect of capacitor 19 upon the system of Fig. 1, it can be seen that capacitor 19 applies the output signal of the cathode follower stage to what, in effect, may be considered as a third input circuit of the first stage. In other words, with the addition of capacitor 19 in the amplifying system of Fig. 1, the output signal of the first stage includes a third component having an amplitude and polarity corresponding to the output signal of the cathode follower stage. Therefore, the alternating-current output signal $e$ of the first stage may be written as $$e=K_1e_1+K_2(e_1-e_2)+K_3e_3 \qquad (9)$$

where $e_1$ is the alternating-current input signal;

$e_2$ is the alternating-current signal applied to the second input circuit of the first stage;

$e_3$ is the alternating-current signal applied to the third input circuit of the first stage; and $K_1$, $K_2$, $K_3$ are constants.

It should be noted that capacitor 19 may be replaced by any other form of bilateral coupling network without altering the mode of operation of the system of Fig. 1. Furthermore, it is clear that the system may be arranged to apply only a portion of the system output signal to the first stage through capacitor 19, rather than the full output signal, as shown in Fig. 1. With this arrangement, the gain of the system may be made to be greater than unity.

Figures 2, 3:
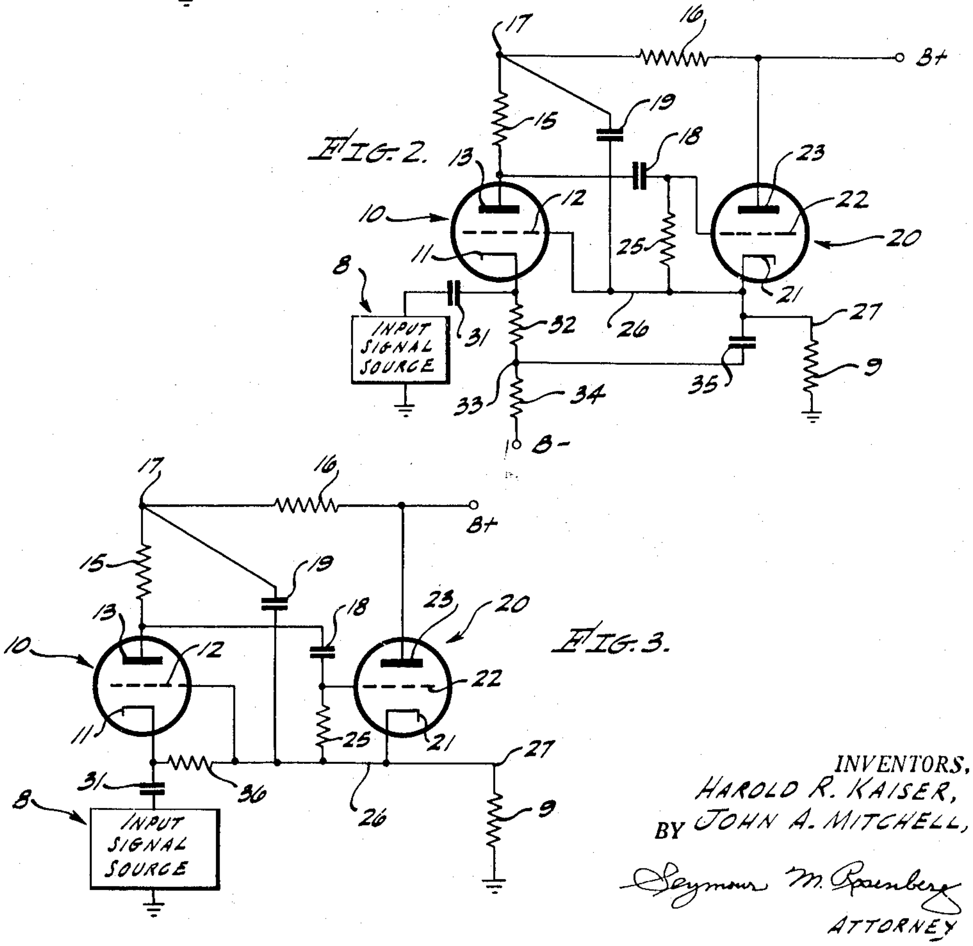
Fig. 2 is a circuit diagram of another embodiment of the amplifying system of this invention which includes a separate direct-current path for the current drawn by the first stage of the system.
Fig. 3 is a circuit diagram of a modified arrangement of the embodiment of Fig. 2 in which the separate direct-current path is provided by a single resistor.

It should be noted that in the embodiment of this invention shown in Fig. 1, the direct current drawn by first stage 10 passes through the source of input signals. Referring now to Fig. 2, there is shown another embodiment of the invention in which the direct current drawn by the first stage does not pass through the source of input signals. As shown in Fig. 2, the amplifier system comprises a first electronic amplifier stage 10 having first and second input circuits and an output circuit, and a second electronic amplifier or cathode follower stage 20 having an input circuit coupled to the output circuit of first stage 10 and an output circuit coupled to load 9 and to the second input circuit of first stage 10. The second input circuit of the first stage is also electrically connected through a cathode load resistor, including a pair of series resistors 32 and 34 having a common junction 33, to the −B terminal of a direct-current power supply, not designated, the other terminal of the power supply being grounded. A bilateral coupling element, such as a capacitor 35, is connected between junction 33 and the cathode output circuit of the cathode follower stage. The input signal from input signal source 8 is applied to the first input circuit of first stage 10 by means of a capacitor 31.

Considering now the operation of the embodiment of

Fig. 2 insofar as the alternating-current input signal is concerned, if capacitor 31 offers a negligible alternating-current impedance, the alternating-current signal response of this embodiment will be identical to that of the embodiment of Fig. 1. On the other hand, capacitor 31 effectively blocks the passage of direct current through the source, and the direct current drawn by the first stage now passes through resistor 32, junction 33, and resistor 34 to the direct-current power supply.

The effective input impedance of the system as seen by source 8 would in the absence of capacitor 35 be determined by the series resistance of resistors 32 and 34. However by incorporating capacitor 35 into the system the effective input impedance is increased. Considering the operation of the system including capacitor 35, if the capacitor offers a negligible alternating-current impedance, junction 33 will have essentially the same signal potential as the cathode of the cathode follower stage. Thus one end of resistor 32 will be at the output signal potential level while the other end is at the input signal potential level. As has been previously shown, the output signal potential is almost identical to the input signal potential and, therefore, the signal difference of potential across resistor 32 is very small. Therefore, only a small signal current flows through resistor 32, and the system offers a high impedance to the input signal.

It is thus seen that the embodiment of the system shown in Fig. 2 is identical in all respects with the embodiment shown in Fig. 1, with the exception of capacitor 31, capacitor 35 and the direct-current cathode resistor network. Insofar as the alternating-current responses of the systems are concerned, the two embodiments function in the same manner. Accordingly, the gain and sensitivity of the embodiment of Fig. 2 will be identical to that of the embodiment of Fig. 1.

Referring now to Fig. 3, there is shown a modified arrangement of the embodiment of Fig. 2 in which the direct current drawn by the first input stage is returned to ground through the load and a single resistor 36. It will be seen that this embodiment is identical in all respects with the embodiment shown in Fig. 2 with the exception that resistor 32, resistor 34 and capacitor 35 have been omitted, and that resistor 36 has been connected between cathode 11 of the first amplifier stage and cathode 21 of the second amplifier stage. The direct current drawn by first amplifier stage 10 now returns to ground through resistor 36 and load 9. Resistor 36 has a resistance value such that the voltage drop thereacross furnishes the proper bias voltage between grid 12 and cathode 11 of the first amplifier stage. The embodiment of Fig. 3 in all other respects operates in a manner identical to that of the embodiment shown in Fig. 2.

A system constructed in accordance with the embodiment shown in Fig. 3 had the following circuit values:

Electronic discharge device 10: Type 5751 (one section)
Cathode follower 20: Type 12AT7 (one section)
Resistance 15: 470,000 ohms
Resistance 16: 100,000 ohms
Resistance 25: 470,000 ohms
Resistance 36: 10,000 ohms
Capacitor 18: .1 microfarad
Capacitor 19: .1 microfarad
Capacitor 31: .1 microfarad In addition, a resistance of 330 ohms was inserted in the cathode circuit of the cathode follower to provide proper bias for the particular tube used.

What is claimed is:

1. An electronic amplifying system for presenting an output signal corresponding to an applied input signal, said system comprising: an electronic vacuum tube stage having first and second input circuits for receiving first and second input signals, respectively, and an output circuit for presenting an output signal having a first component corresponding in amplitude and polarity to said first input signal and a second component corresponding in amplitude and polarity to the signal differential between said first and second input signals; a cathode follower stage having an input circuit for receiving a signal and an output circuit for presenting an output signal corresponding to said input signal; first means for impressing the applied signal on the first input circuit of said electronic vacuum tube stage; second means for applying the output signal of said electronic vacuum tube stage to the input circuit of said cathode follower stage; third means for applying at least a portion of the output signal of said cathode follower stage to the second input circuit of said electronic vacuum tube stage; and fourth means for applying at least a portion of the output signal of said cathode follower stage to the output circuit of said electronic vacuum tube stage.

2. The system defined in claim 1 wherein the last-named means includes a bilateral coupling network connected between the output circuit of said electronic vacuum tube stage and the output circuit of said cathode follower stage.

3. An electronic amplifying system for producing an output signal corresponding to an applied input signal, said system comprising: an electron discharge device having a grid, a cathode and an anode; a cathode follower having a grid and a cathode; means for impressing the applied input signal on the cathode of said electron discharge device; means for applying the signal appearing on the anode of said electron discharge device to the grid of said cathode follower; means for applying at least a portion of the signal appearing on the cathode of said cathode follower to the grid of said electron discharge device; and means for applying at least a portion of the signal appearing on the cathode of said cathode follower to the anode of said electron discharge device.

4. An electronic amplifying system for producing an output signal corresponding to an applied input signal, said system comprising: an electron discharge device having a grid, a cathode and an anode; a cathode follower having a grid and a cathode; means for impressing the applied input signal on the cathode of said electron discharge device; means for coupling the signal appearing on the anode of said electron discharge to the grid of said cathode follower; means for electrically connecting the cathode of said cathode follower to the grid of said electron discharge device; and means for applying negative cathode potential to the cathode of said electron discharge device.

5. The system defined in claim 4 including means for electrically interconnecting the cathode of said cathode follower to the cathode of said electron discharge device.

6. An electronic amplifying system for producing an output signal corresponding to an applied input signal, said system comprising: an electron discharge device having a grid, a cathode and an anode; an anode load interconnecting said anode and a source of positive anode potential; a cathode load interconnecting said cathode and a source of negative cathode potential; a cathode follower having a grid and cathode; means for impressing the applied input signal on the cathode of said electron discharge device; means for applying the signal appearing on the anode of said electron discharge device to the grid of said cathode follower; means for applying the signal appearing on the cathode of said cathode follower to the grid of said electron discharge device; means for applying the signal appearing on the cathode of said cathode follower to an intermediate point of said anode load; and means for applying the signal appearing on the cathode of said cathode follower to an intermediate point of said cathode load.

7. An electronic amplifying system for producing an output signal corresponding to an applied input signal, said system comprising: an electron discharge device having a grid, a cathode and an anode; a cathode follower having a grid and a cathode; an anode load interconnecting said anode and a source of positive anode potential; a cathode load interconnecting the cathode of said electron discharge device and the cathode of said cathode follower; means for impressing the applied input signal on the cathode of said electron discharge device; means for applying the signal appearing on the anode of said electron discharge device to the grid of said cathode follower; means for applying the signal appearing on the cathode of said cathode follower to the grid of said electron discharge device; and means for applying the signal appearing on the cathode of said cathode follower across at least a portion of said anode load of said electron discharge device.

8. The system defined in claim 1 wherein said fourth means includes a capacitor connected between the output circuit of said electronic vacuum tube stage and the output circuit of said cathode follower stage.

9. The system defined in claim 6 wherein said means for applying the signal appearing on the cathode of said cathode follower includes a capacitor coupled between said intermediate point of said anode load and the cathode of said cathode follower.

10. The system defined in claim 7 wherein the last named means includes a capacitor coupled between said portion of said anode load and the cathode of said cathode follower.

11. An electronic amplifying system for producing an output signal corresponding to an applied input signal, said system comprising: an electron discharge device having a grid, a cathode and an anode; a cathode follower having a grid and a cathode; means for impressing the applied input signal on the cathode of said electron discharge device; means for applying the signal appearing on the anode of said electron discharge device to the grid of said cathode follower; means for applying at least a portion of the signal appearing on the cathode of said cathode follower to the grid of said electron discharge device; and a capacitor for applying the signal appearing on the cathode of said cathode follower to the anode of said electron discharge device.

References Cited in the file of this patent

UNITED STATES PATENTS

| | | |
|---|---|---|
| 2,230,483 | Cage | Feb. 4, 1941 |
| 2,270,012 | Shepard | Jan. 13, 1942 |
| 2,298,629 | Schaper | Oct. 13, 1942 |
| 2,313,098 | Shepard | Mar. 9, 1943 |
| 2,386,892 | Hadfield | Oct. 16, 1945 |
| 2,538,488 | Volkers | Jan. 16, 1951 |

FOREIGN PATENTS

| | | |
|---|---|---|
| 103,041 | Sweden | Nov. 18, 1941 |